US007848721B2

(12) United States Patent
Ishiguro (10) Patent No.: US 7,848,721 B2
(45) Date of Patent: Dec. 7, 2010

(54) ANTENNA DAMPING CIRCUIT AND HIGH FREQUENCY RECEIVER EMPLOYING SAME

(75) Inventor: Kazuhisa Ishiguro, Gunma (JP)

(73) Assignee: Ricoh Co., Ltd., Tokyo (JP)

( * ) Notice: Subject to any disclaimer, the term of this patent is extended or adjusted under 35 U.S.C. 154(b) by 605 days.

(21) Appl. No.: 11/908,739

(22) PCT Filed: Nov. 7, 2005

(86) PCT No.: PCT/JP2005/020757

§ 371 (c)(1),
(2), (4) Date: Sep. 14, 2007

(87) PCT Pub. No.: WO2006/098059

PCT Pub. Date: Sep. 21, 2006

(65) Prior Publication Data

US 2009/0009266 A1    Jan. 8, 2009

(30) Foreign Application Priority Data

Mar. 14, 2005   (JP) ............................. 2005-072002

(51) Int. Cl.
*H04B 1/18* (2006.01)
(52) U.S. Cl. .............. 455/193.1; 455/193.2; 455/195.1; 455/192.2; 455/234.1
(58) Field of Classification Search .............. 455/193.1, 455/193.2, 195.1, 192.2, 234.1
See application file for complete search history.

(56) References Cited

U.S. PATENT DOCUMENTS

| 5,196,845 | A * | 3/1993 | Myatt .................... 340/870.31 |
| 6,229,797 | B1 * | 5/2001 | Cho .......................... 370/342 |
| 2005/0237220 | A1 * | 10/2005 | Nolan et al. .......... 340/825.69 |

FOREIGN PATENT DOCUMENTS

| JP | 56130342 | 10/1981 |
| JP | 58158545 | 10/1983 |
| JP | 60260220 | 12/1985 |
| JP | 05009029 | 2/1993 |
| JP | 2002111524 | 4/2002 |
| JP | 2002171149 | 6/2002 |

* cited by examiner

*Primary Examiner*—Sanh D Phu
(74) *Attorney, Agent, or Firm*—Connolly Bove Lodge & Hutz LLP (57) ABSTRACT

An antenna damping circuit in which the frequency characteristics of damping amount can be made substantially flat by providing a resistor (Ra) between PIN diodes (D1, D2) having a resistance varying upon application of a control voltage (Vc) and a capacitive dummy antenna circuit (10), and setting its resistance high enough to neglect the capacity of the dummy antenna circuit (10) sufficiently when the dummy antenna circuit (10) is viewed from the side of the PIN diodes (D1, D2) thereby substantially eliminating the influence of capacity of the dummy antenna circuit (10).

8 Claims, 8 Drawing Sheets

ANTENNA DAMPING CIRCUIT AND HIGH FREQUENCY RECEIVER EMPLOYING SAME

FIELD OF THE INVENTION

The present invention relates to an antenna damping circuit and a high frequency receiver employing the same, and more particularly, to a circuit that performs an AGC operation for controlling signal distortion when a strong signal is inputted to a radio communication apparatus such as a radio receiver.

BACKGROUND OF THE INVENTION

In general, in a wireless communication apparatus such as a radio receiver, an AGC (Automatic Gain Control) circuit is provided to adjust a gain of a reception signal. As a kind of the AGC circuit, there is an antenna damping circuit. The antennal damping circuit operates to reduce a level of a signal received by an antenna. When a reception intensity of an antenna input signal is not very large, the antenna damping circuit does not operate and a level of a reception signal is not reduced. However, when a signal in a strong electric field is inputted to the antenna, the antenna damping circuit operates to prevent excessive electric power from being applied to the wireless communication apparatus.

Figure 1:
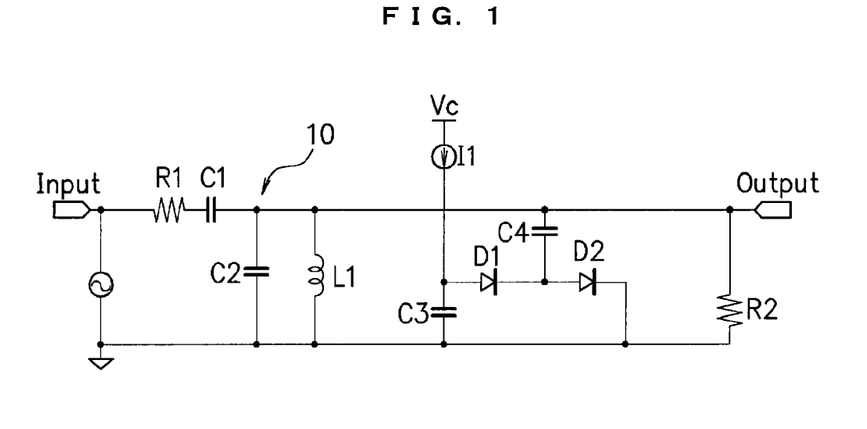
FIG. 1 is a diagram showing an example of a structure of a conventional antenna damping circuit.

FIG. 1 is a diagram showing an example of a structure of a conventional antenna damping circuit. In FIG. 1, reference numeral 10 denotes a dummy antenna circuit. The dummy antenna circuit 10 is constituted by a resistor R1 and a capacitor C1 connected in series to a path extending from an input terminal Input to an output terminal Output of the antenna damping circuit and a capacitor C2 connected in parallel to the path.

Reference sign L1 denotes a coil for removing hum noise from a high-voltage wire; I1, a constant current source controlled according to a control voltage Vc; D1 and D2, PIN diodes; C3 and C4, capacitors; and R2, an output resistor. A not-shown RF (Radio Frequency) amplifier is connected to an output stage of this antenna damping circuit.

In the conventional antenna damping circuit constituted in this way, when a reception intensity of an antenna input signal inputted to the input terminal Input is not very large and the antenna input signal is extracted from the output terminal Output without being damped, the control voltage Vc is set to zero to prevent an electric current from flowing from the constant current source I1 to the PIN diodes D1 and D2. Consequently, the impedance of the PIN diodes D1 and D2 increases to be infinite and the antenna input signal, which has passed through the dummy antenna circuit 10, is directly transmitted to the output terminal Output without passing through a path of the PIN diodes D1 and D2. Thus, damping of the antenna input signal is not performed.

On the other hand, when a reception intensity of an antenna input signal inputted to the input terminal Input is large and the antenna input signal is damped and extracted from the output terminal Output, the control voltage Vc is applied to the constant current source I1 to supply an electric current from the constant current source I1 to the PIN diodes D1 and D2. Consequently, the impedance of the PIN diodes D1 and D2 decreases and the antenna input signal, which has passed through the dummy antenna circuit 10, flows to a ground potential point as well through the PIN diodes D1 and D2. The antenna input signal is substantially damped by the resistance of the PIN diodes D1 and D2 generated at this point and is transmitted to the output terminal Output.

Techniques for damping an antenna input signal using a PIN diode are also disclosed in, for example, Patent Documents 1 and 2.

[Patent Document 1]: Japanese Patent Application Laid-Open No. 5-121907

[Patent Document 2]: Japanese Patent Application Laid-Open No. 9-135180

As a general characteristic required of an antenna damping circuit, "a frequency characteristic of a damping amount in a necessary frequency band is flat". In Patent Documents 1 and 2, contrivances are made to make a frequency characteristic of a damping amount flat.

In Patent Document 1, a variable capacitance element is connected in series or parallel to the PIN diode and a capacitance of the variable capacitance element is changed by a voltage for controlling a variable resistance of the PIN diode, whereby a frequency amplitude characteristic in a frequency band is made flat. In Patent Document 2, a high-pass filter including an antenna coupling capacitor and a resistor is formed and a frequency peak caused because of a resonant circuit, which is formed by a coil provided for measures against electric line interference in an antenna input circuit and another antenna capacitance element, is removed, whereby a frequency characteristic is made flat.

For example, in the case of an AM radio receiver, the dummy antenna circuit 10 including the capacitors C1 and C2 is provided as shown in FIG. 1. In the case of the antenna damping circuit including such a dummy antenna circuit 10, since the dummy antenna circuit 10 has a capacitive property, a frequency characteristic of a damping amount is not made flat being substantially affected by a capacitance of the dummy antenna circuit 10. In other words, a problem occurs in that, as long as a fixed electric current is fed to the PIN diodes D1 and D2, a damping amount in a reception frequency band of an AM broadcast is not fixed.

Figure 2A:
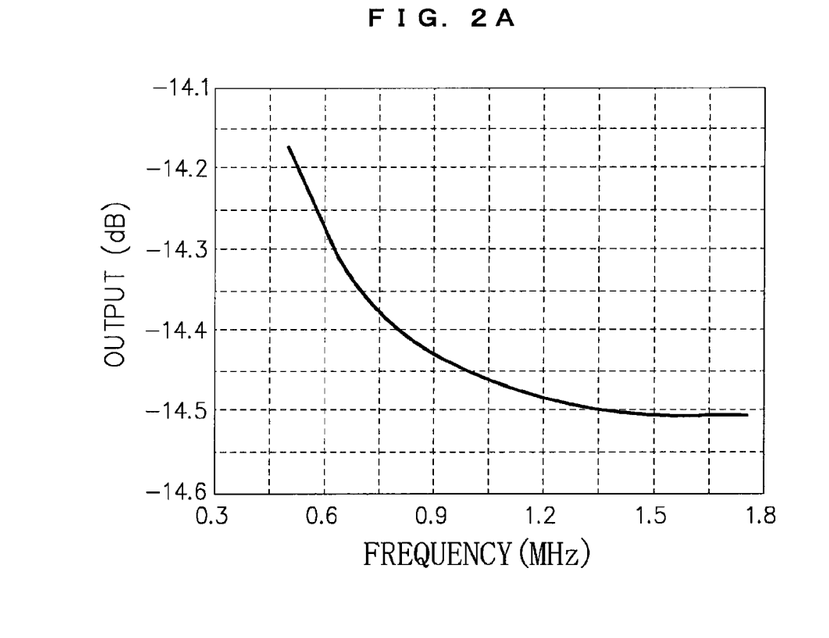
FIG. 2A is a graph showing a frequency characteristic of a damping amount in the conventional antenna damping circuit.
Figure 2B:
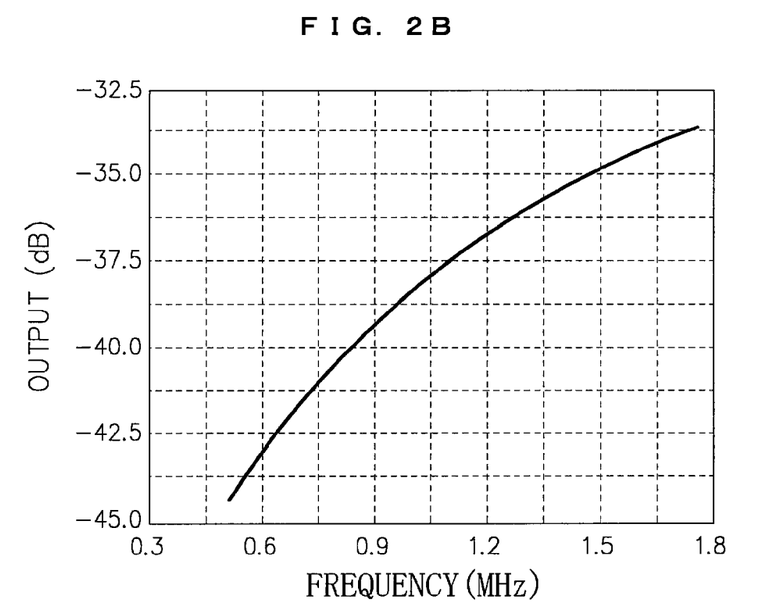
FIG. 2B is a graph showing a frequency characteristic of a damping amount in the conventional antenna damping circuit.
Figure 2C:
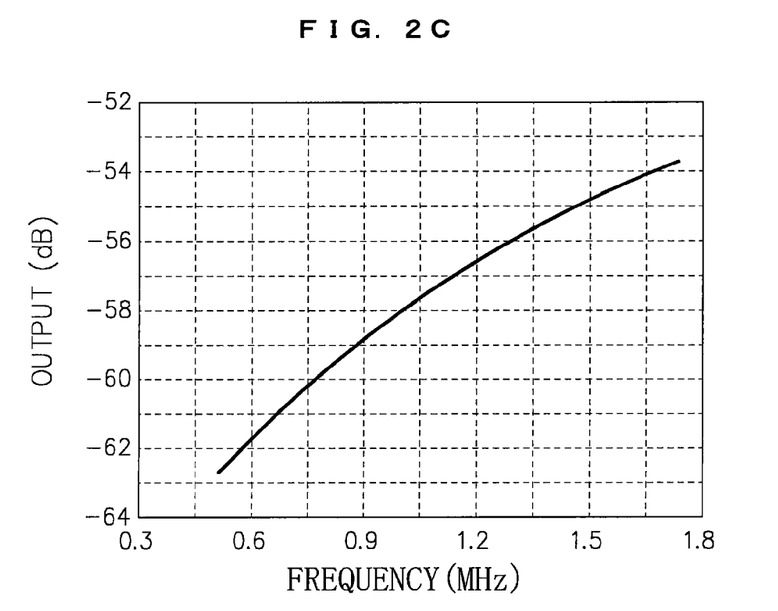
FIG. 2C is a graph showing a frequency characteristic of a damping amount in the conventional antenna damping circuit.

FIGS. 2A to 2C are graphs showing frequency characteristics of a damping amount in the conventional antenna damping circuit. As shown in FIG. 2A, when the control voltage Vc is set to zero to prevent an electric current from flowing from the constant current source I1 to the PIN diodes D1 and D2 (AGC is not applied), a level difference in the AM frequency band is within 1 dB and the damping amount has almost no frequency dependency. On the other hand, when the control voltage Vc is applied to feed electric currents of 100 μA and 1 mA from the constant current source I1 to the PIN diodes D1 and D2 (AGC is applied), as shown in FIGS. 2B and 2C, a level difference for each frequency increases in the AM frequency band and a damping error of about 10 dB at the maximum occurs.

DISCLOSURE OF THE INVENTION

To cope with this problem, it is conceivable to apply the techniques described in Patent Documents 1 and 2. However, the invention of Patent Document 1 has been devised in view of the problem in that a frequency characteristic of a damping amount is not made flat being substantially affected by parasitic reactance inherent in the PIN diode. The invention of Patent Document 2 has been devised in view of the problem in that a peak is caused in a predetermined frequency band because the resonant circuit is formed by the coil provided in the antenna input circuit and another antenna capacitance element. Since both the inventions do not take into account the influence of the capacitive property inherent in the dummy antenna circuit 10 at all, even if these techniques are applied, it is impossible to reduce frequency dependency of a damping amount due to the capacitive property of the dummy antenna circuit 10.

The present invention has been devised to solve such a problem and it is an object of the present invention to reduce frequency dependency of a damping amount in a necessary frequency band and make it possible to make the frequency characteristic of a damping amount flat in an antenna damping circuit having a capacitive circuit at an input stage.

In order to solve the problem, in the antenna damping circuit of the present invention, a resistor or a MOS transistor is provided between a variable resistance element and a capacitive circuit (e.g., a dummy antenna circuit included in an AM high-frequency receiver) connected to a pre-stage of the variable resistance element.

In another aspect of the present invention, plural output paths are provided for the capacitive circuit and a resistor and a variable resistance element are provided for a part of the output paths.

In still another aspect of the present invention, an ON resistance of the MOS transistor is variably controlled.

According to the present invention constituted as described above, since the resistor is present between the variable resistance element and the capacitive circuit, a capacitance of the capacitive circuit viewed from the side of the variable resistance element has a negligibly small influence and it is possible to reduce frequency dependency of a damping amount due to the capacitive property and make a frequency characteristic substantially flat.

When the plural output paths are provided for the capacitive circuit and the resistor and the variable resistance element are provided for a part of the output paths, since no resistor is present in the output path, through which an antenna input signal is transmitted when gain control is not applied, it is possible to minimize deterioration in a noise characteristic.

When the ON resistance of the MOS transistor is variably controlled, by increasing the ON resistance of the MOS transistor when gain control is applied, it is possible to make the influence of the capacitance of the capacitive circuit viewed from the side of the variable resistance element nearly negligibly small and it is possible to reduce frequency dependency of a damping amount due to the capacitive property and make a frequency characteristic substantially flat. On the other hand, by reducing the ON resistance of the MOS transistor when the gain control is not applied, it is possible to minimize deterioration in a noise characteristic.

DETAILED DESCRIPTION OF THE PREFERRED EMBODIMENTS

First Embodiment

Figure 3:
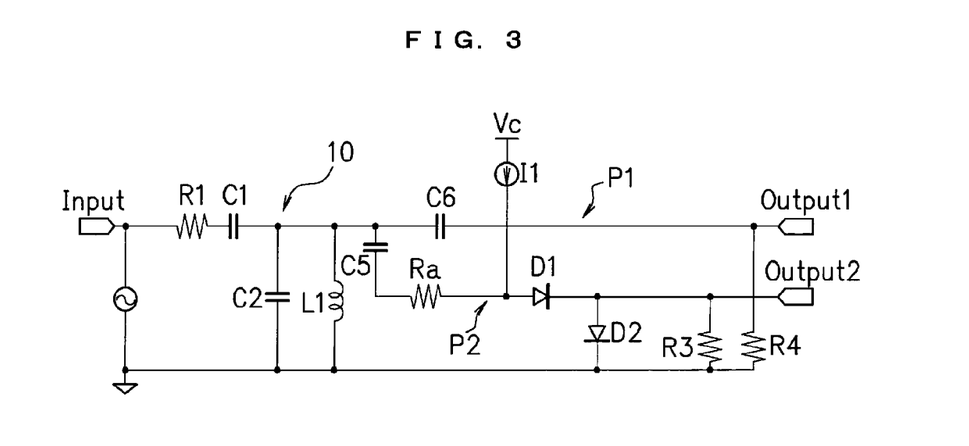
FIG. 3 is a diagram showing an example of a structure of an antenna damping circuit according to an embodiment of the present invention.

A first embodiment of the present invention is explained below on the basis of the drawings. FIG. 3 is a diagram showing an example of a structure of an antenna damping circuit according to a first embodiment. The antenna damping circuit shown in FIG. 3 is implemented in, for example, an AM receiver and includes a dummy antenna circuit 10 (equivalent to a capacitive circuit of the present invention). This dummy antenna circuit 10 is constituted by a resistor R1 and a capacitor C1 connected in series to a path extending from an input terminal Input to an output terminal Output of the antenna damping circuit and a capacitor C2 connected in parallel to the path.

Reference sign L1 denotes a coil for removing hum noise from a high-voltage wire; I1, a constant current source controlled according to a control voltage Vc; D1 and D2, PIN diodes (equivalent to a variable resistance element of the present invention); C5 and C6, capacitors; R3 and R4, output resistors; and Ra, a resistor connected between the dummy antenna circuit 10 and the PIN diodes D1 and D2. The PIN diodes D1 and D2 are variable resistance elements, resistances of which change according to a magnitude of a constant current supplied from the constant current source I1 by the application of the control voltage Vc.

As shown in FIG. 3, in the antenna damping circuit according to the first embodiment, two output paths P1 and P2 are provided on an output side of the dummy antenna circuit 10. The first output path P1 is a circuit system through which an antenna input signal is transmitted to a first output terminal Output1 when AGC is in an inoperative state. The second output path P2 is a circuit system through which an antenna input signal is transmitted to a second output terminal Output2 only when the AGC is in an operative state.

The resistor Ra and the PIN diodes D1 and D2 are provided for the second output path P2. Specifically, the two PIN diodes D1 and D2 are connected in series between the constant current source I1 and the ground. The resistor Ra is connected between an input terminal of the PIN diode D1 on a pre-stage side and the dummy antenna circuit 10. An output terminal of the PIN diode D1 on the pre-stage side (an input terminal of the PIN diode D2 on a post-stage side) is connected to the second output terminal Output2. The resistor Ra has a high resistance of a degree that makes a capacitance of the dummy antenna circuit 10 sufficiently negligible when the dummy antenna circuit 10 is viewed from the side of the PIN diodes D1 and D2.

Figure 4:
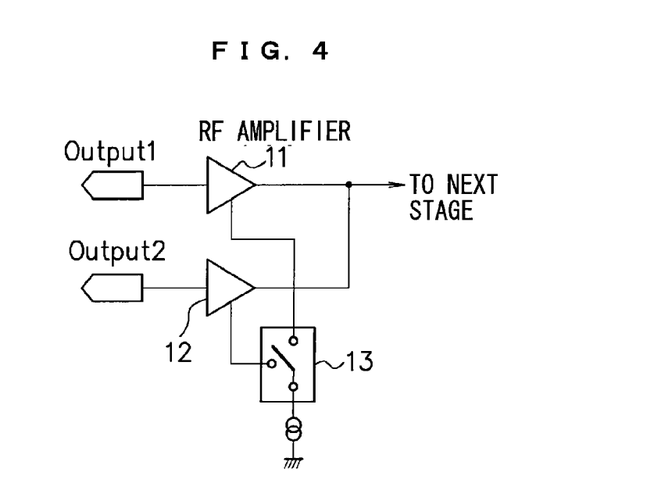
FIG. 4 is a diagram showing an example of a structure of a circuit connected to an output of the antenna damping circuit according to the embodiment.

FIG. 4 is a diagram showing an example of a structure of a circuit connected to an output of the antenna damping circuit according to the first embodiment. As shown in FIG. 4, RF amplifiers (high-frequency amplifiers) 11 and 12 are connected to the two output terminals Output1 and Output 2 of the antenna damping circuit, respectively. Operations of these two RF amplifiers 11 and 12 are controlled by a switch circuit 13.

The switch circuit 13 selectively causes one of the first RF amplifier 11 and the second RF amplifier 12 to operate according to an operation state of the AGC. In other words, when the AGC is in an inoperative state, the first RF amplifier 11 is caused to operate by the switch circuit 13, whereby the first output path P1 is selected. On the other hand, when the AGC is in an operative state, the second RF amplifier 12 is caused to operate by the switch circuit 13, whereby the second output path P2 is selected.

Operations of the antenna damping circuit according to the first embodiment constituted as described above are explained below. When a reception intensity of an antenna input signal applied to the input terminal Input is not very large, the antenna damping circuit brings the AGC into the inoperative state not to damp the antenna input signal. In this case, the control voltage Vc is set to zero to prevent an electric current from flowing from the constant current source I1 to the PIN diodes D1 and D2. The switch circuit 13 selectively causes the first RF amplifier 11 to operate to select the first output path P1.

In this state, the impedance of the PIN diodes D1 and D2 is infinite and the antenna input signal, which has passed through the dummy antenna circuit 10, is transmitted to the first output terminal Output1 through the first output path P1 without passing through the second output path P2 in which the PIN diodes D1 and D2 are provided. Thus, damping of the antenna input signal is not performed.

On the other hand, when a reception intensity of an antenna input signal inputted to the input terminal Input is large, the antenna damping circuit brings the AGC into an operative state to damp the antenna input signal. In this case, the control voltage Vc is applied to supply an electric current from the constant current source I1 to the PIN diodes D1 and D2. The switch circuit 13 selectively causes the second RF amplifier 12 to operate to select the second output path P2.

In this state, the impedance of the PIN diodes D1 and D2 is small and the antenna input signal, which has passed through the dummy antenna circuit 10, is transmitted to the second output terminal Output2 through the second output path P2 on which the PIN diodes D1 and D2 are provided. The antenna input signal is substantially damped by the resistance of the PIN diodes D1 and D2 generated at this point and is outputted from the second output terminal Output2.

Figure 5A:
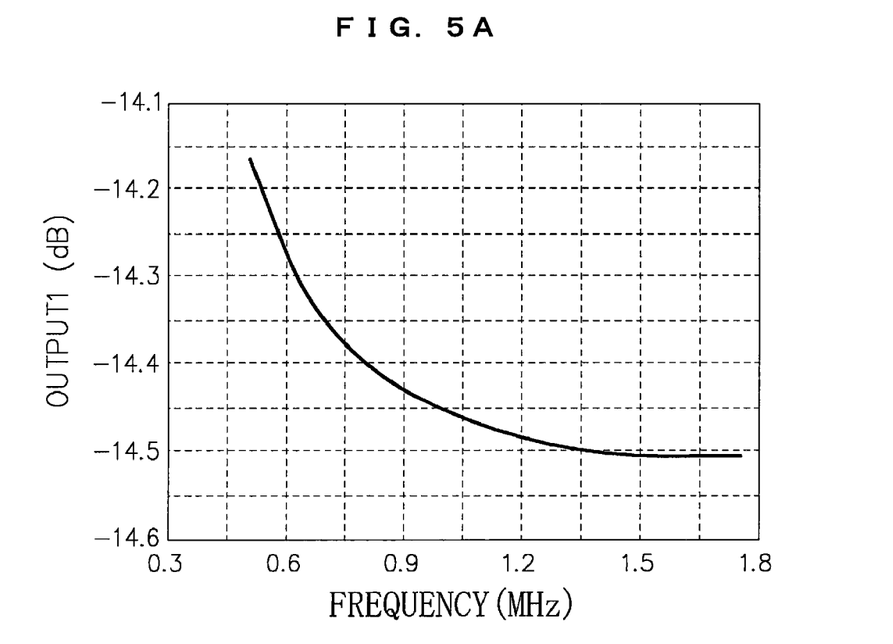
FIG. 5A is a graph showing a frequency characteristic of a damping amount in the antenna damping circuit according to the embodiment.
Figure 5B:
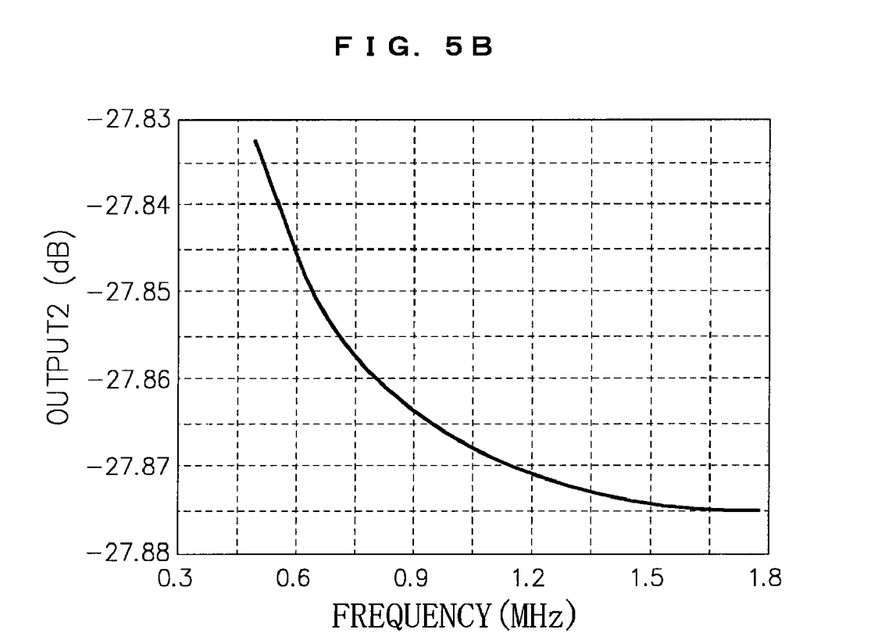
FIG. 5B is a graph showing a frequency characteristic of a damping amount in the antenna damping circuit according to the embodiment.
Figure 5C:
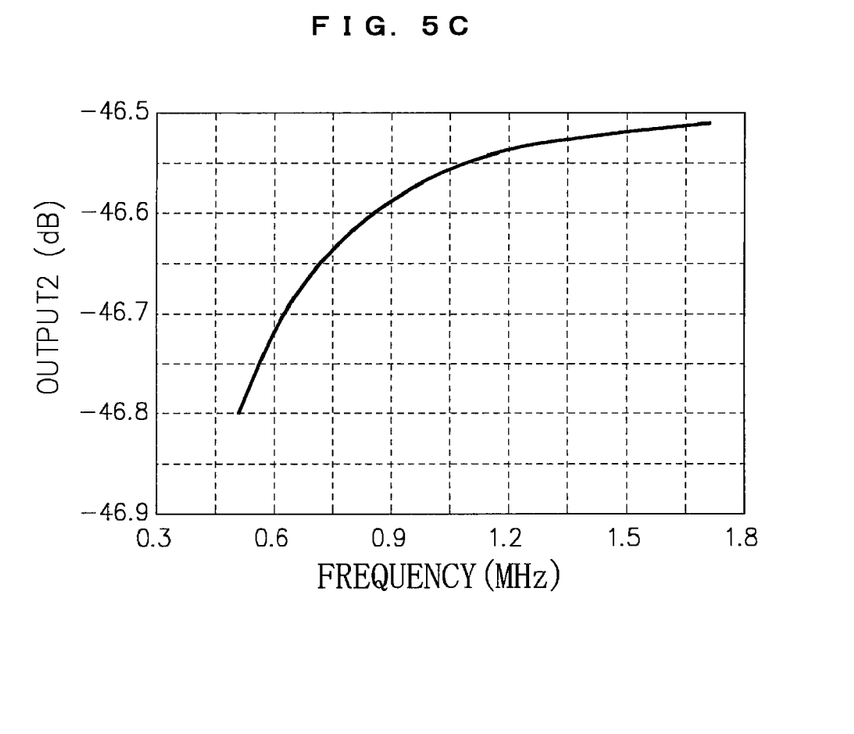
FIG. 5C is a graph showing a frequency characteristic of a damping amount in the antenna damping circuit according to the embodiment.
Figure 5D:
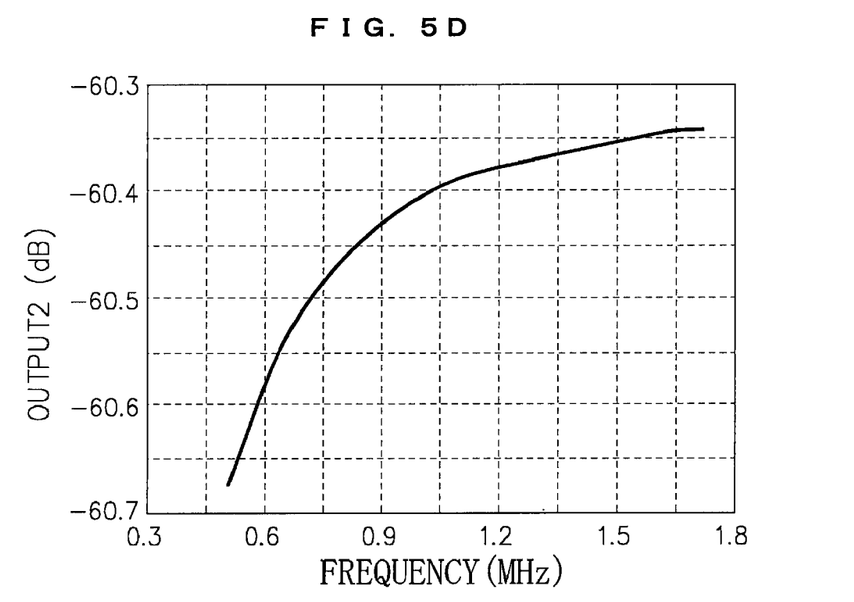
FIG. 5D is a graph showing a frequency characteristic of a damping amount in the antenna damping circuit according to the embodiment.

FIGS. 5A to 5D are graphs showing frequency characteristics of a damping amount in the antenna damping circuit according to the first embodiment. Among the figures, FIG. 5A shows a characteristic in the case in which the control voltage Vc is set to zero to prevent an electric current from flowing from the constant current source I1 to the PIN diodes D1 and D2 (the AGC is not applied). FIG. 5B shows a characteristic in the case in which the control voltage Vc is applied to feed an electric current of 10 μA from the constant current source I1 to the PIN diodes D1 and D2 (an attenuation level ATT at 0.6 MHz is 13 dB). FIG. 5C shows a characteristic in the case in which the control voltage Vc is applied to feed an electric current of 100 μA from the constant current source I1 to the PIN diodes D1 and D2 (the attenuation level ATT at 0.6 MHz is 30 dB). FIG. 5D shows a characteristic in the case in which the control voltage Vc is applied to feed an electric current of 500 μA from the constant current source I1 to the PIN diodes D1 and D2 (the attenuation level ATT at 0.6 MHz is 45 dB).

As it is seen from FIGS. 5A to 5D, a level difference in an AM frequency band is within 1 dB not only when the AGC is not applied but also when the AGC is applied. The damping amount has almost no frequency dependency. In other words, a damping error for each frequency hardly occurs and a frequency characteristic of a damping amount can be made flat.

Figure 6:
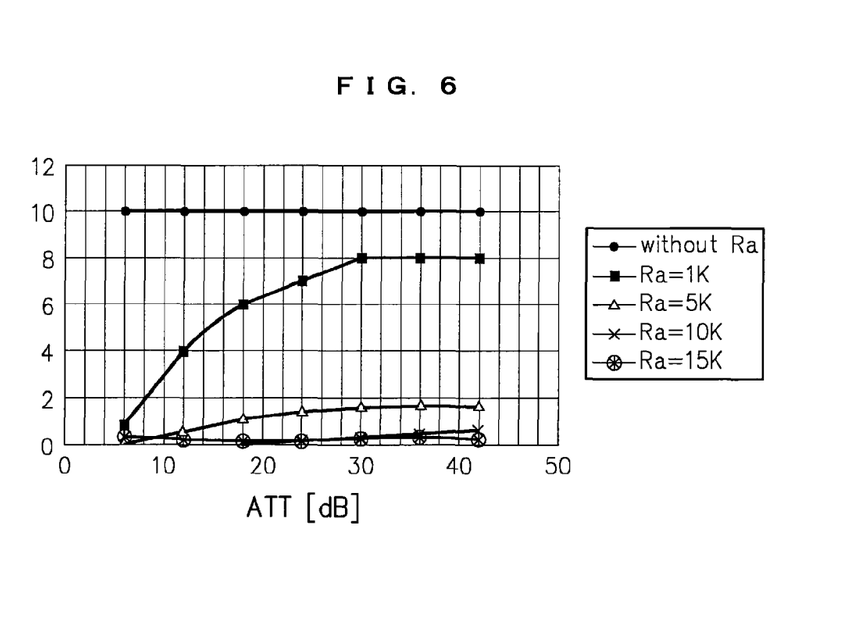
FIG. 6 is a characteristic chart showing a relation between an attenuation level and a damping error due to AGC performed by using the antenna damping circuit according to the embodiment.

FIG. 6 is a characteristic chart showing how a damping error changes when an attenuation level ATT (a gain control amount) by the AGC is changed. The damping error shown in the figure indicates a maximum level difference that occurs in the AM frequency band, i.e., a difference between an output level at the time when a frequency is the lowest and an output level at the time when a frequency is the highest. Characteristics obtained when a value of the resistor Ra is changed to several values are shown in the figure.

As shown in FIG. 6, when the resistor Ra is not present (when the conventional antenna damping circuit shown in FIG. 1 is used), a large damping error of 10 dB occurs regardless of the attenuation level ATT of the AGC. On the other hand, when the antenna damping circuit according to the first embodiment in which the resistor Ra is provided as shown in FIG. 3 is used, it is possible to reduce the damping error compared with the prior art.

However, when a value of the resistor Ra is small at about 1 KΩ, as the attenuation level ATT by the AGC increases, the damping error also increases. On the other hand, when a value of the resistor Ra is set large, even if the attenuation level ATT by the AGC increases, the damping error does not increase much. When a value of the resistor Ra is set to be equal to or larger than 10 KΩ, the damping error is always an extremely small value equal to or smaller than 1 dB regardless of the attenuation level ATT of the AGC. In practical use, the antenna damping circuit can be used when the damping error is about equal to or smaller than 2 dB. Therefore, in order to reduce the damping error to be small enough for practical use, it is preferable that a value of the resistor Ra is equal to or larger than about 5 KΩ.

Figure 7:
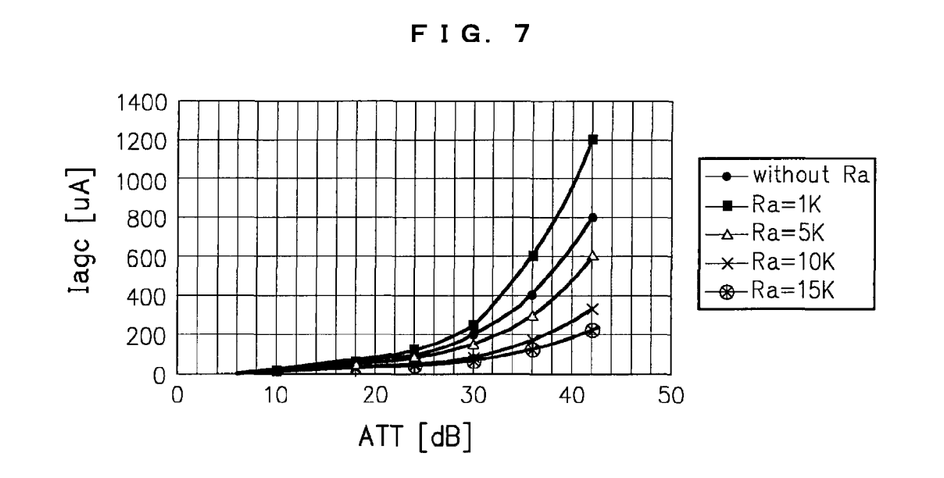
FIG. 7 is a characteristic chart showing a relation between an attenuation level and an AGC current due to AGC performed by using the antenna damping circuit according to the embodiment.

FIG. 7 is a characteristic chart showing how an AGC current changes when the attenuation level ATT by the AGC is changed. Characteristics obtained when a value of the resistor Ra is changed to several values are shown in the figure as well. As shown in FIG. 7, when a value of the resistor Ra is 1 KΩ, an AGC current is large compared with the case in the prior art in which the resistor Ra is not present. On the other hand, when a value of the resistor Ra is equal to or larger than 5 KΩ, an AGC current is smaller than that in the prior art. It is seen that, as a value of the resistor Ra is larger, a smaller AGC current is required. Therefore, in order to reduce the AGC current and reduce electric current consumption, it is preferable to set a value of the resistor Ra as large as possible.

Figure 8:
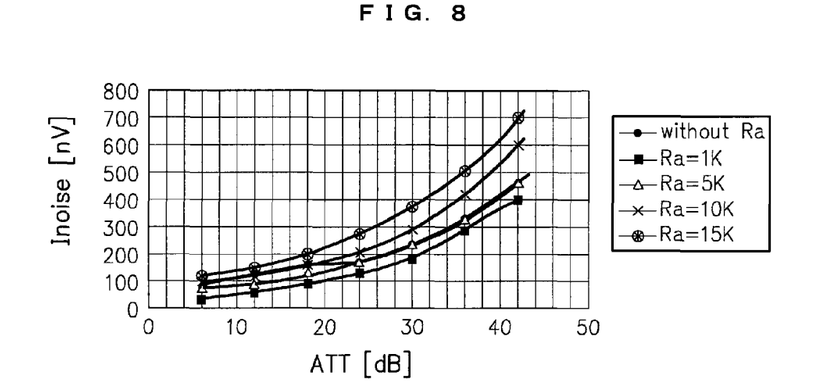
FIG. 8 is a characteristic chart showing a relation between an attenuation level and a noise level due to AGC performed by using the antenna damping circuit according to the embodiment.

FIG. 8 is a characteristic chart showing how current noise changes when the attenuation level ATT by the AGC is changed. Characteristics obtained by changing a value of the resistor Ra to several values are shown in the figure as well. As shown in FIG. 8, when a value of the resistor Ra is relatively small at 1 KΩ and 5 KΩ, a noise level is small compared with the case in which the resistor Ra is not present. When a value of the resistor Ra is 5 KΩ, a noise level is substantially the same as that in the case in the prior art in which the resistor Ra is not present.

On the other hand, when a value of the resistor Ra is relatively large at 10 KΩ and 15 KΩ, a noise level is larger than the case in which the resistor Ra is not present. Therefore, in order to reduce the noise level, it is preferable to reduce a value of the resistor Ra to be equal to or smaller than about 5 KΩ. However, when the AGC is applied in the antenna damping circuit, since a gain is often reduced by the second RF amplifier 12 at the post-stage as well, even if the noise level increases a little because of the presence of the resistor Ra, there is no significant influence. Thus, even if a value of the resistor Ra is set relatively large at 10 KΩ and 15 KΩ, this is not a significant problem in practice.

When the characteristics in FIGS. 6 to 8 are considered comprehensively, it is preferable that a value of the resistor Ra is about 5 to 15 KΩ. It goes without saying that a preferable value of the resistor Ra has to be determined according to tradeoff concerning which of a damping error characteristic, an AGC current characteristic, and a current noise characteristic should be attached importance. In some cases, a value of the resistor Ra may be a value other than 5 to 15 KΩ.

As explained above in detail, in the first embodiment, the first output path P1 through which an antenna input signal is transmitted to the first output terminal Output1 when the AGC is in the inoperative state and the second output path P2 through which an antenna input signal is transmitted to the second output terminal Output2 when the AGC is in the operative state are provided on the output side of the dummy antenna circuit 10. Only for the second output path P2 in which an AGC operation is performed, the resistor Ra is provided between the PIN diodes D1 and D2 and the dummy antenna circuit 10.

With such a structure, the influence of a capacitance at the time when the dummy antenna circuit 10 is viewed from the side of the PIN diodes D1 and D2 is nearly negligibly small and it is possible to reduce the frequency dependency of a damping amount due to the capacitive property and make a frequency characteristic substantially flat. Since the resistor Ra is not present in the first output path P1 through which an antenna input signal is transmitted when the AGC is not applied, it is possible to minimize deterioration in a noise characteristic at the time when the AGC is inoperative. Moreover, by determining an appropriate value (about 5 to 15 KΩ) as a value of the resistor Ra, it is possible to make a damping error characteristic, an AGC current characteristic, and a noise characteristic with respect to an attenuation level of the AGC satisfactory even when the AGC is operative.

Second Embodiment

Figure 9:
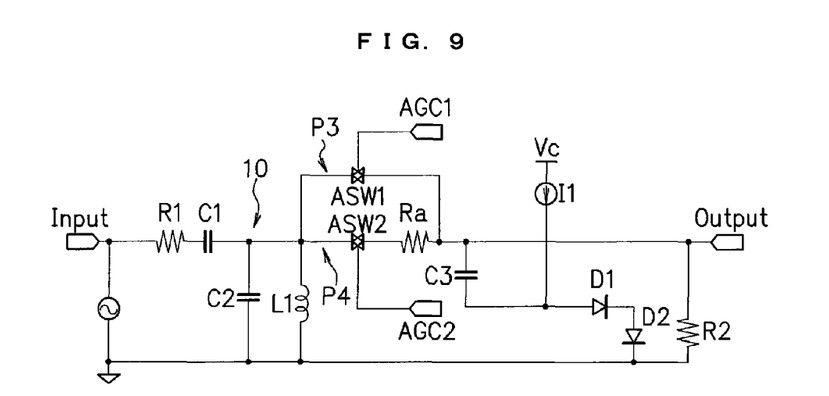
FIG. 9 is a diagram showing an example of a structure of an antenna damping circuit according to a second embodiment.

A second embodiment of the present invention is explained below. FIG. 9 is a diagram showing an example of a structure of an antenna damping circuit according to the second embodiment. The antenna damping circuit shown in FIG. 9 is also implemented in, for example, an AM receiver. In FIG. 9, components denoted by reference numerals and signs identical with those in FIGS. 3 and 1 have the identical functions. Thus, redundant explanations of the components are omitted here.

In FIG. 9, ASW1 and ASW2 denote analog switches. The first analog switch ASW1 is turned on or off according to a control signal inputted from the first AGC control terminal AGC1. The second analog switch ASW2 is turned on or off according to a control signal inputted from a second AGC control terminal AGC2.

In the antenna damping circuit according to the second embodiment, two output paths P3 and P4 are provided on an output side of the dummy antenna circuit 10. The first output path P3 is a circuit system through which an antenna input signal is transmitted to the output terminal Output when the AGC is in an inoperative state. The first output path P3 is a path that bypasses the resistor Ra. The second output path P4 is a circuit system through which an antenna input signal is transmitted to the output terminal Output when the AGC is in an operative state. The second output path P4 is a path that passes the resistor Ra. Both the output paths P3 and P4 are connected to one output terminal Output in common.

Operations of the antenna damping circuit according to the second embodiment constituted as described above are explained below. When a reception intensity of an antenna input signal applied to the input terminal Input is not very large, the antenna damping circuit brings the AGC into an inoperative state not to damp the antenna input signal.

In this case, the first analog switch ASW1 is turned on and the second analog switch ASW2 is turned off. Consequently, the first output path P3 is selected and the antenna input signal, which has passed through the dummy antenna circuit 10, is transmitted to a post-stage through the first output path P3.

When the AGC is inoperative, the control voltage Vc is set to zero to prevent an electric current from flowing from the constant current source I1 to the PIN diodes D1 and D2. In this state, the impedance of the PIN diodes D1 and D2 is infinite and the antenna input signal, which has passed through the first output path P3, is directly transmitted to the output terminal Output without passing through the path in which the PIN diodes D1 and D2 are provided. Thus, damping of the antenna input signal is not performed.

On the other hand, when a reception intensity of an antenna input signal inputted to the input terminal Input is large, the antenna damping circuit brings the AGC into an operative state to damp the antenna input signal. In this case, the first analog switch ASW1 is turned off and the second analog switch ASW2 is turned on. Consequently, the second output path P4 is selected and the antenna input signal, which has passed through the dummy antenna circuit 10, is transmitted to the post-stage through the second output path P4.

When the AGC is operative, the control voltage Vc is applied to supply an electric current from the constant current source I1 to the PIN diodes D1 and D2. In this state, the impedance of the PIN diodes D1 and D2 is small and the antenna input signal, which has passed through the second output path P4, flows to the ground potential point as well through the PIN diodes D1 and D2. The antenna input signal is substantially damped by the resistance of the PIN diodes D1 and D2 generated at this point and outputted from the output terminal Output.

In the second embodiment constituted in this way, it is possible to obtain characteristics same as those in FIGS. 5 to 8. By making the resistor Ra effective when the AGC is operative, the influence of a capacitance when the dummy antenna circuit 10 is viewed from the side of the PIN diodes D1 and D2 becomes nearly negligibly small and it is possible to reduce the frequency dependency of a damping amount due to the capacitive property and reduce a damping error due to a frequency. By making the resistor Ra ineffective when the AGC is inoperative, it is possible to minimize deterioration in a current noise characteristic.

In the antenna damping circuit according to the second embodiment, one output terminal Output only has to be provided. Thus, there is also an advantage that the two RF amplifiers 11 and 12 in FIG. 4 do not have to be provided.

Third Embodiment

Figure 10:
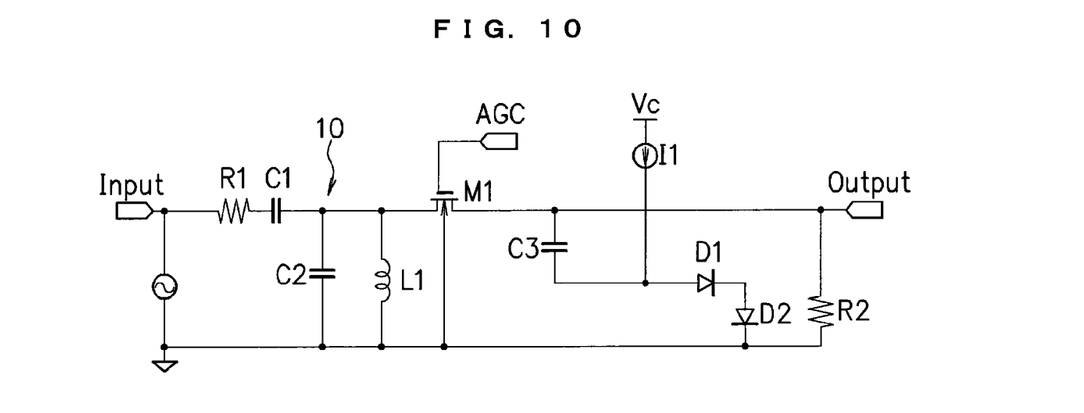
FIG. 10 is a diagram showing an example of a structure of an antenna damping circuit according to a third embodiment.

A third embodiment of the present invention is explained below. FIG. 10 is a diagram showing an example of a structure of an antenna damping circuit according to the third embodiment. The antenna damping circuit shown in FIG. 10 is also implemented in, for example, an AM receiver. In FIG. 10, components denoted by reference numerals and signs same as those in FIG. 9 have the identical functions. Thus, redundant explanations of the components are omitted here.

In FIG. 10, reference sign M1 denotes a MOS transistor. An operation region of the MOS transistor M1 is controlled according to a control signal inputted from an AGC control terminal AGC. In other words, the MOS transistor M1 is controlled to operate in a saturation region when the AGC is in an inoperative state and operate in a non-saturation region when the AGC is in an operative state.

In the antenna damping circuit according to the third embodiment, only one output terminal Output is provided and an output path from the dummy antenna circuit 10 to the output terminal Output is only one system. The MOS transistor M1 is present on the output path.

Operations of the antenna damping circuit according to the third embodiment constituted as described above are explained below. When a reception intensity of an antenna input signal applied to the input terminal Input is not very large, the antenna damping circuit brings the AGC into an inoperative state not to damp an antenna input signal. In this case, the antenna damping circuit causes the MOS transistor M1 to operate in the saturation region according to a control signal inputted from the AGC control terminal AGC. Consequently, an ON resistance of the MOS transistor M1 decreases.

When the AGC is inoperative, the control voltage Vc is set to zero to prevent an electric current from flowing from the constant current source I1 to the PIN diodes D1 and D2. In this state, the impedance of the PIN diodes D1 and D2 is infinite and the antenna input signal, which has passed through the MOS transistor M1, is directly transmitted to the output terminal Output without passing through the path in which the PIN diodes D1 and D2 are provided. Thus, attenuation of the antenna input signal is not performed.

On the other hand, when a reception intensity of an antenna input signal inputted to the input terminal Input is large, the antenna damping circuit brings the AGC into an operative state to attenuate the antenna input signal. In this case, the antenna damping circuit causes the MOS transistor M1 to operate in a non-saturation region according to a control signal inputted from the AGC control terminal AGC. Consequently, an ON resistance of the MOS transistor M1 increases.

When the AGC is operative, the control voltage Vc is applied to supply an electric current from the constant current source I1 to the PIN diodes D1 and D2. In this state, the impedance of the PIN diodes D1 and D2 is small and the antenna input signal, which has passed through the MOS transistor M1, flows to the ground potential point as well through the PIN diodes D1 and D2. The antenna input signal is substantially damped by the resistance of the PIN diodes D1 and D2 generated at this point and outputted from the output terminal Output.

In the third embodiment constituted in this way, it is possible to obtain characteristics same as those in FIGS. 5 to 8. By making an ON resistance of the MOS transistor M1 effective when the AGC is operative, the influence of a capacitance when the dummy antenna circuit 10 is viewed from the side of the PIN diodes D1 and D2 becomes nearly negligibly small and it is possible to reduce the frequency dependency of a damping amount due to the capacitive property and reduce a damping error due to a frequency. By making the ON resistance of the MOS transistor M1 ineffective when the AGC is inoperative, it is possible to minimize deterioration in a current noise characteristic.

In the antenna damping circuit according to the third embodiment, one output terminal Output only has to be provided as in the second embodiment. Thus, there is also an advantage that the two RF amplifiers 11 and 12 in FIG. 4 do not have to be provided.

Fourth Embodiment

Figure 11:
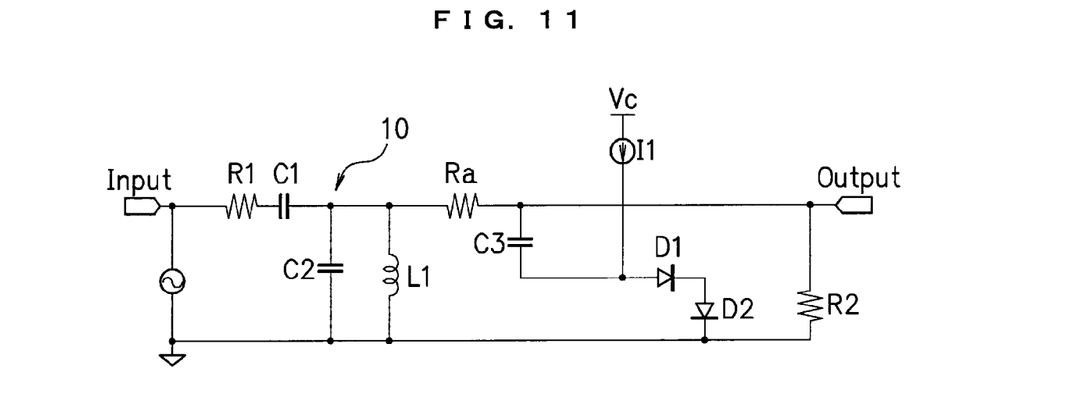
FIG. 11 is a diagram showing an example of a structure of an antenna damping circuit according to a fourth embodiment.

A fourth embodiment of the present invention is explained below. FIG. 11 is a diagram showing an example of a structure of an antenna damping circuit according to the fourth embodiment. The antenna damping circuit shown in FIG. 11 is also implemented in, for example, an AM receiver. In FIG. 11, components denoted by reference numerals and signs same as those in FIG. 9 have the identical functions. Thus, redundant explanations of the components are omitted here.

Referring to the characteristics in FIGS. 6 to 8, when a value of the resistor Ra is set to, for example, 5 KΩ, a damping error is equal to or smaller than 2 dB at all attenuation levels and an AGC current is smaller than that in the prior art. Current noise is also smaller, although slightly, than that in the prior art. In other words, it can be said that all the characteristics are more satisfactory compared with those in the prior art. In particular, regardless of the fact that the resistor Ra is provided, a noise characteristic is better on the contrary. Therefore, when a value of the resistor Ra is set to a value near 5 KΩ, it is not always necessary to divide the output path into two systems (P1 and P2) as in FIG. 3.

Thus, in the fourth embodiment, as shown in FIG. 11, an output path from the dummy antenna circuit 10 to the output terminal Output is only one system and the resistor Ra is provided between the dummy antenna circuit 10 and the PIN diodes D1 and D2 present on the path. However, a value of the resistor Ra is set to a value near 5 KΩ.

In the fourth embodiment constituted in this way, as in the embodiments described above, the influence of a capacitance when the dummy antenna circuit 10 is viewed from the side of the PIN diodes D1 and D2 becomes nearly negligibly small and it is possible to reduce the frequency dependency of a damping amount due to the capacitive property and reduce a damping error due to a frequency. It is possible to minimize deterioration in a current noise characteristic. Since only one output terminal Output has to be provided, the two RF amplifiers 11 and 12 in FIG. 4 do not have to be provided.

In the first to fourth embodiments, an antenna input signal is damped using the PIN diodes D1 and D2. However, variable resistance elements other than the PIN diodes D1 and D2 may be used. In the first to fourth embodiments, the dummy antenna circuit 10 is cited as an example of the capacitive circuit. However, the capacitive circuit other than the dummy antenna circuit 10 may be used.

In the example explained in the first embodiment, the output side of the dummy antenna circuit 10 is divided into the two systems of the first and second output paths P1 and P2, the first output path P1 is used as a path at the time when the AGC is inoperative, and the second output path P2 is used as a path at the time when the AGC is operative. However, the present invention is not limited to this. For example, an output path is divided into output paths of three or more systems, one of the output paths is used as a path at the time when the AGC is inoperative and the other paths are used as paths at the time when the AGC is operative. Values of the resistor Ra connected to the output paths at the time when the AGC is operative may be set different from one another and the output path of one of the resistances may be selectively used according to an attenuation level ATT by the AGC.

For example, a first output path in which the resistor Ra is not present, a second output path in which a value of the resistor Ra is 1 KΩ, and a third output path in which a value of the resistor Ra is 10 KΩ are provided. The first output path is used when the AGC is inoperative, the second output path is used when the attenuation level ATT of the AGC is a low level equal to or lower than 6 dB, and the third output path is used when the attenuation level ATT of the AGC is equal to or higher than 6 dB.

As shown in FIGS. 6 and 7, in a region where the attenuation level ATT of the AGC is equal to or lower than 6 dB, even if a value of the resistor Ra is 1 KΩ, since a damping error and an AGC current are extremely small, practical use of the antenna damping circuit is possible. Moreover, as shown in FIG. 8, since a noise level is small compared with that in the prior art, this is more preferable than adopting 10 KΩ and 15 KΩ as a resistance. However, when the attenuation level ATT of the AGC is larger than 6 dB, although a noise level is still small compared with that in the prior art, a damping error and an AGC current increase. Thus, when the attenuation level ATT of the AGC is larger than 6 dB, by switching a resistance to, for example, 10 KΩ, it is possible to hold down the damping error and the AGC current while keeping the noise level in a practically allowable range.

Similarly, in the second embodiment, it is possible to divide an output path into output paths of three or more system. Values of the resistor Ra connected to the output paths at the time when the AGC is operative may be set different from one another and the output path of one of the resistances may be selectively used according to an attenuation level ATT by the AGC.

In the third embodiment, it is also possible to change a magnitude of an ON resistance of the MOS transistor M1 to three or more stages according to a control signal inputted from the AGC control terminal AGC to the MOS transistor M1. The ON resistance of the MOS transistor M1 may be variably controlled to any one of resistances according to the attenuation level ATT by the AGC.

All of the first to fourth embodiments are merely examples of materialization in carrying out the present invention. The technical range of the present invention should not be limitedly interpreted by the embodiments. In other words, the present invention can be carried out in various forms without departing from the spirit or the main characteristics thereof.

INDUSTRIAL APPLICABILITY

The present invention is useful for an antenna damping circuit in which a capacitive circuit including a capacitor is provided at an input stage. For example, since an AM receiver includes a capacitive dummy antenna circuit at an antenna input stage, the antenna damping circuit of the present invention is suitably used for the AM receiver.

The invention claimed is:

1. An antenna damping circuit including a variable resistance element, a resistance of which changes according to an applied voltage, the antenna damping circuit damping an antenna input signal using the variable resistance element, comprising:
   a resistor connected in series between the variable resistance element and a capacitive circuit connected to a pre-stage of the variable resistance element, wherein
   plural output paths are provided for the capacitive circuit and the resistor and the variable resistance element is provided for a part of the output paths;
   a pair of variable resistance elements are connected in series between a constant current source that supplies a constant current according to the applied voltage and a ground; and
   the resistor is connected between an input terminal of the variable resistance element on a pre-stage side and the capacitive circuit and an output terminal of the variable resistance element on the pre-stage side is connected to an output end of the part of the output paths.

2. The antenna damping circuit according to claim 1, the resistor has a high resistance of a degree that makes a capacitance of the capacitive circuit sufficiently negligible when the capacitive circuit is viewed from the side of the variable resistance element.

3. The antenna damping circuit according to claim 1, a plurality of the parts of the output paths are present, values of the resistor connected to the parts of the output paths are set different from each other.

4. The antenna damping circuit according to claim 3, the resistor has a high resistance of a degree that makes a capacitance of the capacitive circuit sufficiently negligible when the capacitive circuit is viewed from the side of the variable resistance element.

5. The antenna damping circuit according to claim 1, the resistor has a high resistance of a degree that makes a capacitance of the capacitive circuit sufficiently negligible when the capacitive circuit is viewed from the side of the variable resistance element.

6. A high frequency receiver, comprising:
   the antenna damping circuit according to claim 1;
   plural high frequency amplifiers connected to the plural output paths, respectively; and
   a switch circuit that selectively causes any one of the plural high frequency amplifiers to operate according to an operation state of gain control.

7. The antenna damping circuit according to claim 1, the resistor has a high resistance of a degree that makes a capacitance of the capacitive circuit sufficiently negligible when the capacitive circuit is viewed from the side of the variable resistance element.

8. An antenna damping circuit including a variable resistance element, a resistance of which changes according to an applied voltage, the antenna damping circuit damping an antenna input signal using the variable resistance element, comprising:
   a MOS transistor provided between the variable resistance element and a capacitive circuit connected to a pre-stage of the variable resistance element, wherein
   an ON resistance of the MOS transistor is variably controlled; and
   the antenna damping circuit has a mode for reducing the ON resistance by causing the MOS transistor to operate in a saturation region and a mode for increasing the ON resistance by causing the MOS transistor to operate in a non-saturation region.

* * * * *